United States Patent
Jaeger et al.

(10) Patent No.: US 9,444,074 B2
(45) Date of Patent: Sep. 13, 2016

(54) METHOD FOR PRODUCING AN OPTOELECTRONIC COMPONENT AND OPTOELECTRONIC COMPONENT

(71) Applicant: OSRAM OLED GmbH, Regensburg (DE)

(72) Inventors: Arndt Jaeger, Regensburg (DE); Daniel Steffen Setz, Boeblingen (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/430,947

(22) PCT Filed: Sep. 27, 2013

(86) PCT No.: PCT/EP2013/070193
§ 371 (c)(1),
(2) Date: Mar. 25, 2015

(87) PCT Pub. No.: WO2014/049121
PCT Pub. Date: Apr. 3, 2014

(65) Prior Publication Data
US 2015/0255752 A1 Sep. 10, 2015

(30) Foreign Application Priority Data
Sep. 28, 2012 (DE) .................. 10 2012 109 209

(51) Int. Cl.
*H01L 21/00* (2006.01)
*H01L 51/52* (2006.01)
(Continued)

(52) U.S. Cl.
CPC ....... *H01L 51/5268* (2013.01); *H01L 51/0096* (2013.01); *H01L 51/5215* (2013.01);
(Continued)

(58) Field of Classification Search
CPC .......... H01L 51/0096; H01L 51/5215; H01L 51/5268; H01L 51/5237; H01L 51/5275; H01L 51/56
See application file for complete search history.

(56) References Cited

U.S. PATENT DOCUMENTS 6,309,991 B1  10/2001  Borrelli et al.
6,906,452 B2  6/2005  Ichikawa
(Continued)

FOREIGN PATENT DOCUMENTS

CN  1871182 A  11/2006
CN  102203025 A  9/2011
(Continued)

OTHER PUBLICATIONS

Do et al.; Enhanced Light Extraction from Organic Light Emitting Diodes with 2D SiO2/SiNx Photonic Crystals; Adv. Mater. 15; No. 14; Jul. 17, 2003.
(Continued)

*Primary Examiner* — Nicholas Tobergte
(74) *Attorney, Agent, or Firm* — Viering, Jentschura & Partner mbB

(57) ABSTRACT

Various embodiments may relate to a method for producing an optoelectronic component. The method may include increasing a refractive index of a substrate in at least one region at at least one predefined position in the substrate in such a way that the region having an increased refractive index extends as far as a surface of the substrate, and forming an electrode layer on or above the surface of the substrate at least partly above the region having an increased refractive index.

18 Claims, 10 Drawing Sheets

(51) Int. Cl.
*H01L 51/00* (2006.01)
*H01L 51/56* (2006.01)

(52) U.S. Cl.
CPC ....... *H01L51/5237* (2013.01); *H01L 51/5275* (2013.01); *H01L 51/56* (2013.01); *Y02E 10/549* (2013.01); *Y02P 70/521* (2015.11)

(56) References Cited

U.S. PATENT DOCUMENTS

| | | | |
|---|---|---|---|
| 7,208,431 | B2 | 4/2007 | Wolff et al. |
| 2002/0118271 | A1* | 8/2002 | Mashimo ............ H01L 51/5262 347/241 |
| 2003/0119652 | A1 | 6/2003 | Kuhn et al. |
| 2007/0257608 | A1 | 11/2007 | Tyan et al. |
| 2011/0266562 | A1 | 11/2011 | Huignard et al. |
| 2013/0270542 | A1 | 10/2013 | Setz |

FOREIGN PATENT DOCUMENTS

| | | | |
|---|---|---|---|
| DE | WO 02085807 | A2 * | 10/2002 ............ B41M 5/262 |
| DE | 102008015697 | A1 | 10/2009 |
| DE | 102010063511 | A1 | 6/2012 |
| DE | WO 2012084630 | A1 * | 6/2012 ......... H01L 51/5275 |
| KR | 1020110073615 | A | 6/2011 |

OTHER PUBLICATIONS

Stoian et al.; Designing laser-induced refractive index changes in "thermal" glasses; Proc. SPIE 700518; 2008.

Sun & Forrest; Enhanced light out-coupling of organic light-emitting devices using embedded low-index grids; Nature Photonics 2; 483-487; Jul. 11, 2008.

German Search Report based on Application No. 10 2012 109 209.5(5 Pages) dated Jul. 11, 2013 (Reference Purpose Only).

Piao et al.; Temperature dependence of UV-induced compaction in fused silica; Proc. SPIE 3051; Optical Microlithography X; 907 ; Jul. 7, 1997; doi:10.1117/12.276046.

Chinese Office Action based on Application No. 201380051164. 0(10 Pages and 6 pages of English translation) dated Mar. 30, 2016 (Reference Purpose Only).

Korean Office Action based on Application No. 10-2015-7010974(6 Pages and 7 pages of English translation) dated Mar. 31, 2016 (Reference Purpose Only).

* cited by examiner

METHOD FOR PRODUCING AN OPTOELECTRONIC COMPONENT AND OPTOELECTRONIC COMPONENT

RELATED APPLICATIONS

The present application is a national stage entry according to 35 U.S.C. §371 of PCT application No. PCT/EP2013/070193 filed on Sep. 27, 2013, which claims priority from German application No. 10 2012 109 209.5 filed on Sep. 28, 2012, and is incorporated herein by reference in its entirety.

TECHNICAL FIELD

Various embodiments may relate to a method for producing an optoelectronic component and to an optoelectronic component.

BACKGROUND

An optoelectronic component (e.g. an organic light emitting diode (OLED)) on an organic basis is usually distinguished by a mechanical flexibility and moderate production conditions. Compared with a component composed of inorganic materials, an optoelectronic component on an organic basis can be produced potentially cost-effectively on account of the possibility of large-area production methods (e.g. roll-to-roll production methods).

Therefore, optoelectronic components on an organic basis, for example OLEDs, are being increasingly widely used and can be employed for the illumination of surfaces. In this case, a surface can be understood for example as a table, a wall or a floor.

An organic optoelectronic component, for example an OLED, may include an anode and a cathode with an organic functional layer system therebetween. The organic functional layer system may include one or a plurality of emitter layer/s in which electromagnetic radiation is generated, one or a plurality of charge generating layer structure each composed of two or more charge generating layers (CGL) for charge generation, and one or a plurality of electron blocking layers, also designated as hole transport layer(s) (HTL), and one or a plurality of hole blocking layers, also designated as electron transport layer(s) (ETL), in order to direct the current flow.

In an OLED, the light generated thereby is partly coupled out directly from the OLED. The rest of the light is distributed into various loss channels, as is illustrated in an illustration of an OLED 100 in FIG. 1. FIG. 1 shows an organic light emitting diode 100 including a glass substrate 102 and a transparent electrode layer 104 composed of indium tin oxide (ITO) arranged thereon. An organic emitting layer 106 is arranged on the electrode layer 104. A second electrode layer 108 composed of a metal is arranged on the organic emitting layer. An electric current supply 110 is connected to the electrode layer 104 and to the second electrode layer 108, such that an electric current for generating light flows through the layer structure arranged between the electrode layers 104, 108.

In organic light emitting diodes, without technical aids a large part of the light (approx. 75%) is lost within the component, for example on account of reflection of a part of the generated light at the interface between the glass substrate 102 and air (symbolized by an arrow 112) and on account of reflection of a part of the generated light at the interface between the first electrode layer 104 and the glass substrate 102 (symbolized by a second arrow 114). That part of the generated light which is coupled out from the glass substrate 102 through the substrate surface provided for coupling-out (the emitted light) is symbolized by a third arrow 116 in FIG. 1.

The generated light that is not coupled out via the substrate surface can be made usable by the two approaches of external and internal coupling-out: solution approaches for eliminating this problem are based on increasing the external coupling-out, which can be achieved by modifying the outer side of the substrate glass up to 50% coupling-out efficiency.

External coupling-out device or structure here shall denote devices or structures which increase the proportion of the light which is coupled out from the substrate into emitted light. Such devices or structures or methods for producing such structures may be:

(a) films having scattering particles on the outer side of the substrate;
(b) films having surface structures (e.g. microlenses);
(c) direct structuring of the outer side of the substrate;
(d) introduction of scattering particles in the glass.

Some of these approaches (e.g. scattering films) have already been used in OLED lighting modules, or the upscaleability thereof has been shown. However, increasing the external coupling-out has two major disadvantages:

1. The coupling-out efficiency is limited to a maximum of 50% (on account of the jump in refractive index between the organic emitting layer or organic functional layer structure (for short: organic system) or the transparent electrode and glass).
2. The modification of the outer side disadvantageously alters the appearance of the OLED, since the high-quality (polished) glass surface is lost.

This does not suffice for high-efficiency OLEDs, however, and it is desirable to enable so-called internal coupling-out. In the case of internal coupling-out, the light guided in the organic system and the transparent electrode layer is coupled out into the substrate. By increasing the internal coupling-out, it is theoretically possible to couple out up to 80% of the generated light.

However, increasing the internal coupling-out is very complex. There are a number of known technological approaches, although they are not yet being used in OLED products. Such approaches include, for example:

(1) Sun and Forrest describe in Nature Photonics 2, 483 (2008) so-called low-index grids. The latter consist of structured regions including a material having a low refractive index which are applied on the transparent electrode.
(2) US 2007/0257608 describes high refractive index scattering layers below the transparent electrode in a polymeric matrix or in an additionally inserted high refractive index glass layer. In this case, high refractive index denotes a higher refractive index than the glass substrate.
(3) Do et al. describe in Advanced Materials 15, 1214 (2003) so-called Bragg gratings or photonic crystals having periodic structures in the range of the wavelength of visible light.

All the known methods for internally coupling out light constitute a high outlay in terms of process engineering.

SUMMARY

In various embodiments, a method is provided which allows the increase in the internal coupling-out to be realized cost-effectively by virtue of a direct inline process being implemented, that is to say a process which can be integrated into the previous production process, and which can dispense with complex structuring methods or high-temperature processes with respect to the glass melt.

A laser-induced refractive index change (as described in R. Stoian et al., Proceedings SPIE 700518 (2008), 1-15, B. Kuhn and B. Uebbing, US 2003/0119652, N. F. Borrelli et al., U.S. Pat. No. 6,309,991-B1 or S. Wolff and U. Woelfel, U.S. Pat. No. 7,208,431-B2) affords the possibility of increasing a refractive index of a glass. This process is called compaction and is associated with a permanent densification of the glass. Depending on the type of glass and the process conditions, either compaction or the inverse process of decompaction occurs.

On the basis of this process, it is possible to create an inline method which enables the internal coupling-out to be increased in the case of OLEDs. In the case of this method, either before or after deposition of a transparent electrode and an organic system with the aid of a laser a surface (or an interface between transparent electrode and substrate, for example glass substrate) is processed and an increase in the refractive index is brought about as a result.

As a result, the component has the technical device for increasing the internal coupling-out.

In a subsequent step, by the method of laser internal engraving, for example, in which a laser is used to locally heat a region of the substrate such that the substrate is locally melted and a light-scattering region is produced, it is possible to bring about a scattering effect within the refractive-index-increased region of the glass.

Various embodiments make it possible to produce an optoelectronic component, for example an organic light emitting diode (OLED), with which, for example, the coupling-out of light from one or more organic layers or transparent electrodes of the optoelectronic component can be improved. For example, refractive-index-increased regions can be produced by local heating of the substrate, for example by compaction by a laser.

In various embodiments, a method for producing an optoelectronic component is provided. The method may include forming at least one region having an increased refractive index at at least one predefined position in a substrate in such a way that the region having an increased refractive index extends as far as a surface of the substrate, and forming an electrode layer on or above the surface of the substrate at least partly above the region having an increased refractive index.

The method may include increasing a refractive index of a substrate in at least one region at at least one predefined position in the substrate in such a way that the region having an increased refractive index extends as far as a surface of the substrate, and forming an electrode layer on or above the surface of the substrate at least partly above the region having an increased refractive index.

In one configuration, the method may furthermore include forming at least one light-scattering region at at least one predefined position in the substrate before forming the electrode layer, wherein the at least one light-scattering region is formed at least partly within the at least one region having an increased refractive index.

In another configuration, the electrode layer can be translucent or transparent.

In another configuration, forming the region having an increased refractive index is carried out by locally heating the substrate.

In another configuration, increasing the refractive index of the substrate in the region having an increased refractive index is carried out by locally heating the substrate.

In another configuration, locally heating the substrate is carried out using a laser, preferably in such a way that a compaction is carried out.

In another configuration, the region having an increased refractive index can have a thickness of at least 1 µm perpendicular to the surface of the substrate.

In another configuration, a layer in the substrate which has one or a plurality of the regions having an increased refractive index can extend parallel to the surface of the substrate over a part of the area covered with the electrode layer.

In another configuration, the layer can extend substantially parallel to the surface of the substrate substantially over the entire area covered with the electrode layer.

In another configuration, forming the at least one region having an increased refractive index may furthermore include changing the relative position of substrate and laser between two exposures.

In another configuration, increasing the refractive index in the at least one region may furthermore include changing the relative position of substrate and laser between two exposures.

In another configuration, the method may furthermore include applying a masking that is non-transmissive to light having a wavelength of the laser on the substrate before forming the region having an increased refractive index; and removing the masking after forming the region having an increased refractive index.

In another configuration, the method may furthermore include applying a masking that is non-transmissive to light having a wavelength of the laser on the substrate before increasing the refractive index in the at least one region; and removing the masking after increasing the refractive index in the at least one region.

In another configuration, forming the regions having an increased refractive index can be carried out in an arrangement and form that enables total internal reflection of light that penetrates into the substrate from the direction of the surface at regions in the layer which do not have an increased refractive index.

In another configuration, increasing the refractive index in the at least one region can be carried out in an arrangement and form that enables total internal reflection of light that penetrates into the substrate from the direction of the surface at regions in the layer which do not have an increased refractive index.

In another configuration, furthermore, at least one region having a reduced refractive index can be formed within the regions in the layer which do not have an increased refractive index, wherein forming the region having a reduced refractive index is carried out by locally heating the substrate, and wherein locally heating the substrate is carried out using a laser, preferably in such a way that a decompaction is carried out.

In another configuration, the method may furthermore include forming an organic functional layer structure on or above the electrode layer.

In another configuration, when forming the region having an increased refractive index, the refractive index can be increased to a layer-thickness-weighted average value of the refractive indexes of an organic functional layer structure that has already been applied or is yet to be applied and of an electrode that has already been applied or is yet to be applied.

In another configuration, when increasing the refractive index in the at least one region, the refractive index can be increased to a layer-thickness-weighted average value of the refractive indexes of an organic functional layer structure that has already been applied or is yet to be applied and of an electrode that has already been applied or is yet to be applied.

In another configuration, forming the light-scattering region can be carried out by locally heating the substrate.

In another configuration, locally heating the substrate can be carried out using a laser, preferably in such a way that a laser internal engraving is carried out.

In another configuration, the method can furthermore including forming a second electrode layer on or above the organic functional layer structure.

In another configuration, the method may furthermore include forming an encapsulation layer.

In another configuration, the substrate may include quartz glass, flint glass, window glass, soda-lime glass or crown glass.

In various embodiments, a method for producing an optoelectronic component is provided. The method may include forming an electrode layer on or above a surface of a substrate and forming at least one region having an increased refractive index at at least one predefined position in the substrate in such a way that the region having an increased refractive index is formed at least partly at an interface with the electrode layer.

The method may include forming an electrode layer on or above a surface of a substrate and increasing a refractive index of the substrate in a region at at least one predefined position in the substrate in such a way that the region having an increased refractive index is formed at least partly at an interface with the electrode layer.

In one configuration, the method may furthermore include forming at least one light-scattering region at at least one predefined position in the substrate before forming the electrode layer, wherein the at least one light-scattering region is formed at least partly within the at least one region having an increased refractive index.

In another configuration, the electrode layer can be translucent or transparent.

In another configuration, forming the region having an increased refractive index is carried out by locally heating the substrate.

In another configuration, increasing the refractive index in the region having an increased refractive index is carried out by locally heating the substrate.

In another configuration, locally heating the substrate is carried out using a laser, preferably in such a way that a compaction is carried out.

In another configuration, the region having an increased refractive index can have a thickness of at least 1 µm perpendicular to the surface of the substrate.

In another configuration, a layer in the substrate which has one or a plurality of the regions having an increased refractive index can extend parallel to the surface of the substrate over a part of the area covered or to be covered with the electrode layer.

In another configuration, the layer can extend parallel to the surface of the substrate substantially over the entire area covered or to be covered with the electrode layer.

In another configuration, forming the at least one region having an increased refractive index may furthermore include changing the relative position of substrate and laser between two exposures.

In another configuration, increasing the refractive index in the at least one region may furthermore include changing the relative position of substrate and laser between two exposures.

In another configuration, the method may furthermore include applying a masking that is non-transmissive to light having a wavelength of the laser on the substrate before forming the region having an increased refractive index; and removing the masking after forming the region having an increased refractive index.

In another configuration, the method may furthermore include applying a masking that is non-transmissive to light having a wavelength of the laser on the substrate before increasing the refractive index in the at least one region; and removing the masking after increasing the refractive index in the at least one region.

In another configuration, forming the regions having an increased refractive index can be carried out in an arrangement and form that enables total internal reflection of light that penetrates into the substrate from the direction of the surface at regions in the layer which do not have an increased refractive index.

In another configuration, increasing the refractive index in the at least one region can be carried out in an arrangement and form that enables total internal reflection of light that penetrates into the substrate from the direction of the surface at regions in the layer which do not have an increased refractive index.

In another configuration, the method may furthermore include forming at least one region having a reduced refractive index within the regions in the layer which do not have an increased refractive index; wherein forming the region having a reduced refractive index is carried out by locally heating the substrate; and wherein locally heating the substrate (202) is carried out using a laser, preferably in such a way that a decompaction is carried out.

In another configuration, the method may furthermore include forming an organic functional layer structure on or above the electrode layer.

In another configuration, when forming the region having an increased refractive index, the refractive index can be increased to a layer-thickness-weighted average value of the refractive indexes of the organic functional layer structure and the electrode.

In another configuration, forming the light-scattering region can be carried out by locally heating the substrate.

In another configuration, locally heating the substrate can be carried out using a laser, preferably in such a way that a laser internal engraving is carried out.

In another configuration, the method can furthermore including forming a second electrode layer on or above the organic functional layer structure.

In another configuration, the method may furthermore include forming an encapsulation layer.

In another configuration, the substrate may include quartz glass, flint glass, window glass, soda-lime glass or crown glass.

In various embodiments, an optoelectronic component is provided, wherein the optoelectronic component includes a substrate, and also an electrode layer arranged on or above a surface of the substrate, and wherein the substrate has at the surface at least partly below the electrode layer at least one region having an increased refractive index.

In various embodiments, an optoelectronic component is provided, wherein the optoelectronic component includes a substrate, and also an electrode layer arranged on or above a surface of the substrate, and wherein the substrate has at the surface at least partly below the electrode layer at least one region having a refractive index increased by an increase in the refractive index of the substrate.

In one configuration, the optoelectronic component may include at least one light-scattering region at at least one predefined position in the substrate, wherein the at least one light-scattering region is formed at least partly within the at least one region having an increased refractive index.

In another configuration, the electrode layer can be translucent or transparent.

In another configuration, the substrate can be compacted in the at least one region having an increased refractive index.

In another configuration, the region having an increased refractive index can have a thickness of at least 1 μm perpendicular to the surface of the substrate.

In another configuration, a layer in the substrate which has one or more of the regions having an increased refractive index can extend parallel to the surface of the substrate over a part of the area covered or to be covered with the electrode layer.

In another configuration, the layer can extend parallel to the surface of the substrate substantially over the entire area covered or to be covered with the electrode layer.

In another configuration, the at least one region having an increased refractive index can be configured such that total internal reflection of light that penetrates into the substrate from the direction of the surface is possible at at least one region in the layer which does not have an increased refractive index.

In another configuration, the at least one region in the layer which does not have an increased refractive index can have at least one region having a reduced refractive index, and the substrate in the at least one region having a reduced refractive index can be decompacted.

In another configuration, the optoelectronic component may furthermore include an organic functional layer structure on or above the transparent electrode layer.

In another configuration, the region having an increased refractive index can have a refractive index which corresponds to a layer-thickness-weighted average value of the refractive indexes of the organic functional layer structure and the electrode.

In another configuration, the substrate can be laser-internally-engraved in the at least one light-scattering region.

In another configuration, the optoelectronic component may furthermore include a second electrode layer on or above the organic functional layer structure.

In another configuration, the optoelectronic component may furthermore include an encapsulation layer.

In another configuration, the substrate may include quartz glass, flint glass or crown glass.

In various embodiments, the term "transparent" or "transparent layer" can be understood to mean that a layer is transmissive to light (for example at least in a partial range of the wavelength range of from 380 nm to 780 nm and for example at a wavelength of a laser used for compaction or laser internal engraving), wherein light coupled into a structure (for example a layer) is also coupled out from the structure (for example layer) substantially without scattering or light conversion.

In various embodiments, the term "translucent" or "translucent layer" can be understood to mean that a layer is transmissive to light, for example to the light generated by the optoelectronic component, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer).

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims. In the figures, identical or similar elements are provided with identical reference signs, insofar as this is expedient.

In various embodiments, the optoelectronic component can be part of an integrated circuit. Furthermore, a plurality of optoelectronic components can be provided, for example in a manner accommodated in a common housing.

In the context of the compaction, the decompaction or the laser internal engraving, in various embodiments, a laser can be used which generates and emits light having a wavelength at which the substrate and the layers (for example the encapsulation layer) through which radiation is transmitted during the compaction, the decompaction or the engraving are translucent or transparent.

Hereinafter, a process in which, at a relative position of focused laser light and substrate, the substrate is irradiated with the laser light until it can be expected that the desired effect (compaction, decompaction or internal engraving) has occurred is designated as an exposure, and the associated position as exposure position.

Figure 1:
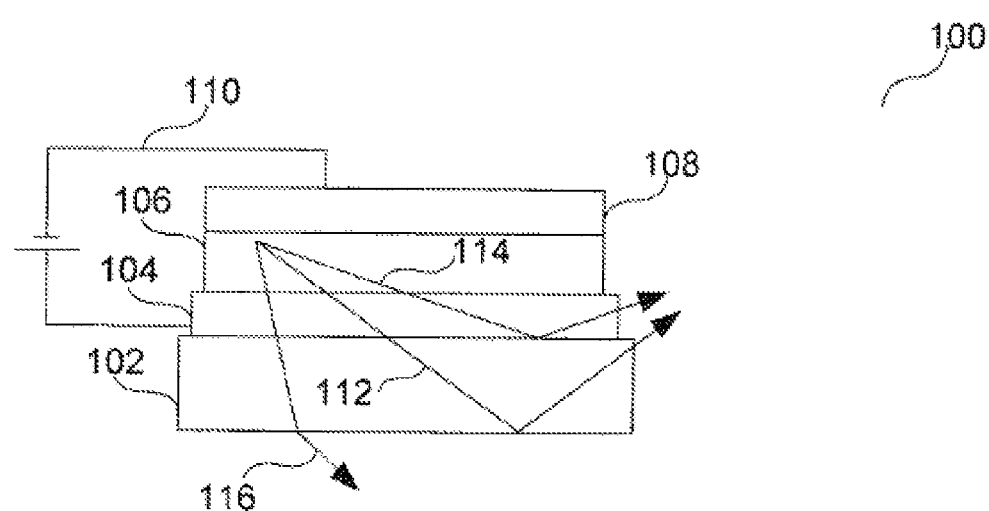
FIG. 1 shows an illustration of a conventional organic light emitting diode.
Figure 2:
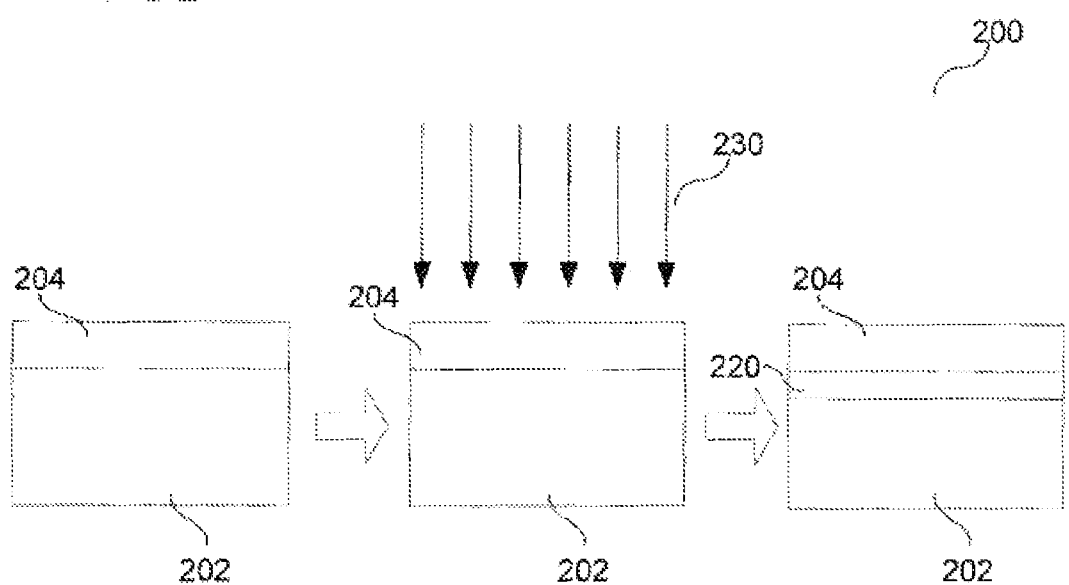
FIG. 2 shows an illustration of the laser processing for locally increasing the refractive index.

FIG. 2 shows an illustration of the process of laser processing for increasing the refractive index.

If a glass substrate 202, for example with a transparent or translucent electrode layer 204 arranged thereon or thereabove, is irradiated with laser light, represented by arrows 230, laser (for example wavelength, power, pulse duration, pulse rate and focusing) and substrate can be coordinated with one another such that a compacted region or a compacted layer 220 forms in the irradiated substrate.

With the use of a focusing optical system, the laser power can be applied to a substrate point in a targeted manner, for example to the interface between transparent electrode 204 (for example indium tin oxide, ITO) and glass 202.

Figure 3:
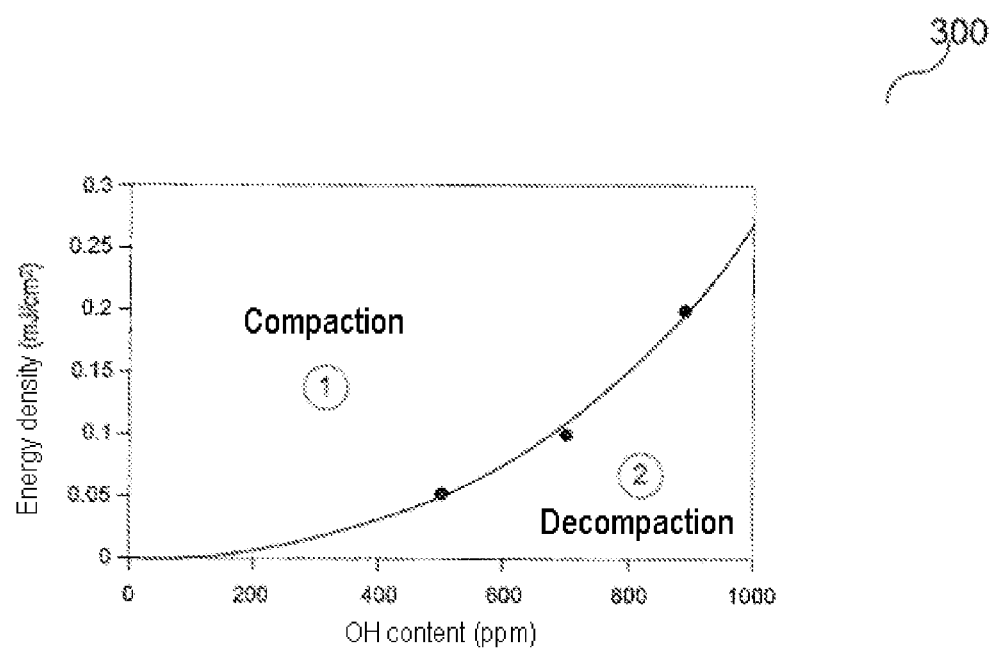
FIG. 3 shows one example of the occurrence of compaction during the laser processing of a glass substrate.

FIG. 3 shows an example of the occurrence of compaction during the laser processing of an OH-containing glass substrate.

Material processing with ultra-short laser pulses makes possible in the solid (here: glass substrate) local deviations from the thermodynamic equilibrium of the surroundings. The spatial redistribution of the pulse energy in the glass can be simulated by the solution of the nonlinear Schrodinger equation (see R. Stoian et al., Proceedings SPIE 700518 (2008) pages 1 to 15). In this case, the ultra-short laser pulse generates a hot region that is under high pressure. The thermal expansion begins and an elasto-plastic wave travels through the glass, it being plastically deformed. The thermal wave then follows on a microseconds time scale. The relatively slow cooling associated therewith finally leads to the relaxation of the compressed region and a mass redistribution.

On the basis of this physical model, it is conceivable that this process is greatly dependent on the pulse energy, the pulse duration and repetition rate. It goes without saying that the glass used and the wavelength of the laser likewise play an important part. By way of example, in Stoian et al., Proceedings SPIE 700518 (2008) 1-15, BK 7-glass is irradiated with 150 fs pulses of an 800 nm Ti:sapphire laser and a refractive index increase of +0.5% is observed.

The compaction process in pure quartz glass irradiated with pulsed UV light having wavelengths of less than 250 nm (see US 2003/0119652 A1), is greatly dependent on the additives $H_2$, OH, SiH groups and Cl. By way of example, as illustrated in FIG. 3, given a low OH content, for example 200 ppm, a compaction can already take place at a low energy density, for example starting from an energy density of approximately 0.01 $mJ/cm^2$. Given a higher OH content, for example given an OH content of approximately 300 ppm, a decompaction can take place at the same energy density of approximately 0.01 $mJ/cm^2$. Parameter pairs assigned to a point within that region of the graph in FIG. 3 which is identified by "1" can lead to a compaction of the substrate. Parameter pairs which are assigned to a point within that region of the graph in FIG. 3 which is identified by "2" can lead to a decompaction of the substrate.

The glass transmission typically does not vary during the compaction process. The set (relativized) state with increased refractive index is stable.

Figure 4:
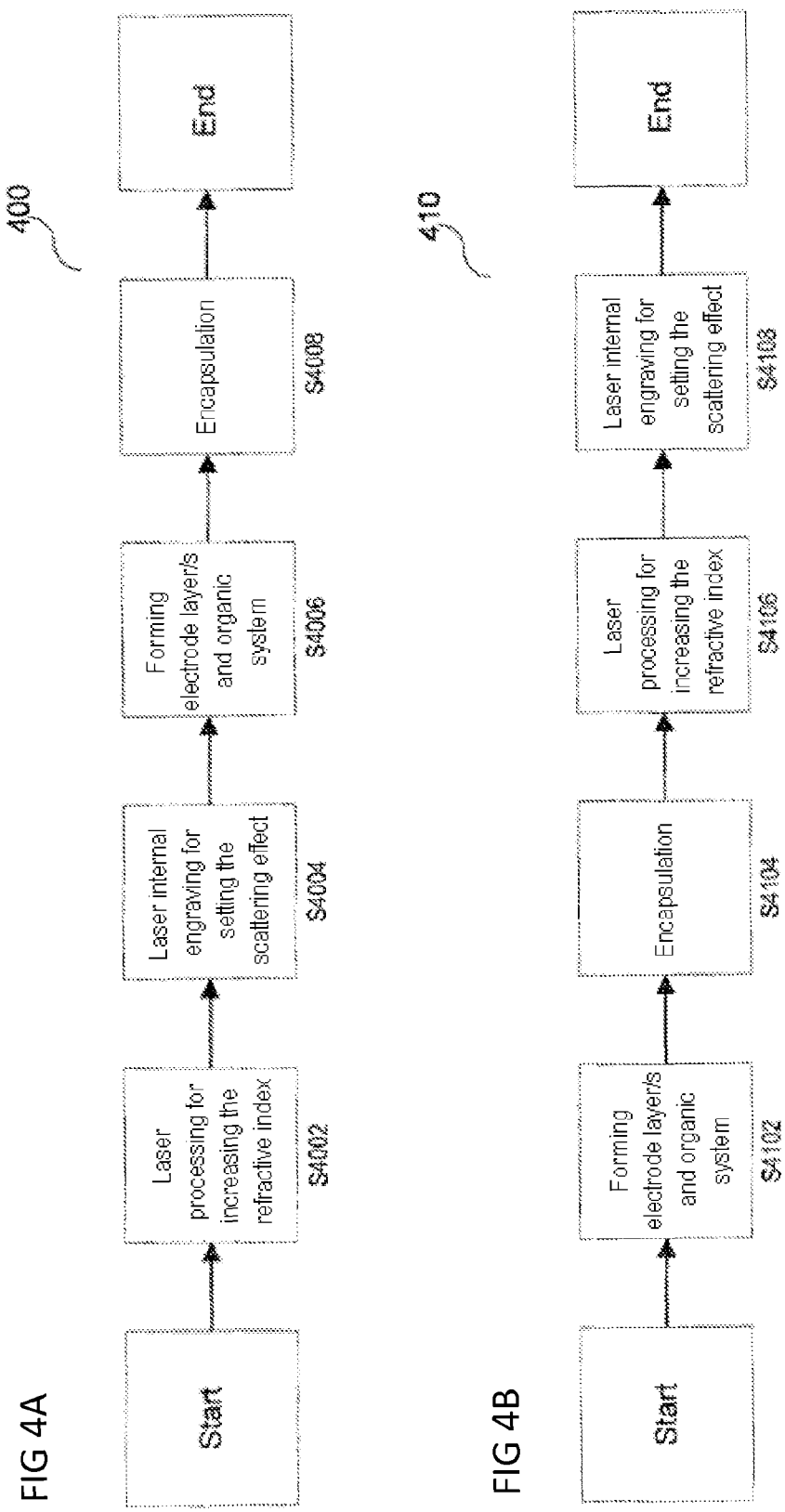
FIGS. 4A and 4B show flow diagrams illustrating methods for producing an optoelectronic component in accordance with various embodiments.

FIG. 4A and FIG. 4B show flow diagrams 400 and 410 illustrating methods for producing an optoelectronic component in accordance with various embodiments.

Since the laser radiation is used in a focused manner in the case of the conceivable inline process flows outlined schematically in FIG. 4A and FIG. 4B, the laser processing can be carried out either before or after the deposition of the electrodes or the organic system and the encapsulation.

In various embodiments, in accordance with the method illustrated in FIG. 4A, a laser processing of a surface of a substrate for increasing the refractive index of the substrate can be carried out in S4002. Furthermore, a laser internal engraving of the substrate in the refractive-index-increased region for setting a scattering effect can be carried out in S4004. Furthermore, a transparent electrode can be formed on or above the substrate at least partly above the region having an increased refractive index and an organic functional layer structure can be formed on or above the transparent electrode in S4006. Finally, an encapsulation or an encapsulation layer can be formed in S4008.

In various embodiments, in accordance with the method illustrated in FIG. 4B, in S4102 a transparent electrode can be formed on or above a substrate provided and an organic functional layer structure can be formed on or above the transparent electrode. Furthermore, an encapsulation or an encapsulation layer can be formed in S4104. A laser processing of a surface of a substrate at an interface with the transparent electrode for increasing the refractive index of the substrate can be carried out in S4106. Finally, a laser internal engraving of the substrate in the refractive-index-increased region for setting a scattering effect can be carried out in S4108.

In S4002 or S4106 laser (for example the parameters of wavelength, power, pulse duration, pulse rate and focusing) and substrate can be coordinated with one another such that a compacted region or a compacted layer having a higher refractive index than the substrate forms in the irradiated substrate.

With the use of a focusing optical system, the laser power can be applied to a substrate point in a targeted manner, for example to the interface between transparent electrode (for example indium tin oxide, ITO) and glass.

In one embodiment, the compaction S4002, S4106 of a larger region or of a plurality of regions can be carried out by changing the relative position of substrate and focused laser light between two exposures. To put it another way, a compaction S4002, S4106 of a region can be carried out at an exposure position, then the substrate or the laser device or a part thereof, for example an optical element, can be moved, such that the focal position of the laser light lies in a new region of the substrate, and a further exposure or compaction can subsequently be carried out. To put it another way, the larger region or a plurality of regions can be compacted by the region or the regions being scanned.

In one embodiment, the compaction S4002, S4106 of a larger region or of a plurality of regions can be carried out by the laser light not being focused in a substantially punctiform fashion, but rather in such a way that the focal region has an extent in both directions which are parallel to the surface of the substrate. Regions in which no compaction is provided can be covered by a device that is non-transmissive, e.g. reflective, for the laser light during the exposure, for example by a mask layer being applied before the exposure.

Both embodiments mentioned above can be combined in a further embodiment.

During the compaction S4002 or S4106, a plurality of lasers can be used, for example simultaneously.

In S4004 or S4108 laser (for example the parameters of wavelength, power, pulse duration, pulse rate and focusing) and substrate can be coordinated with one another such that a laser internal engraving forms in the irradiated substrate, in which the scattering effect is increased.

With the use of a focusing optical system, the laser power can be applied to a substrate point in a targeted manner, for example to a point which lies within the compacted region.

In one embodiment, the laser internal engraving S4004, S4108 of a larger region or of a plurality of regions can be carried out by changing the relative position of substrate and focused laser light between two exposures. To put it another way, a laser internal engraving S4004, S4108 of a region can be carried out at an exposure position, then the substrate or the laser device or a part thereof, for example an optical element, can be moved, such that the focal position of the laser light lies in a new region of the substrate, and a further exposure or laser internal engraving can subsequently be carried out. To put it another way, the larger region or a plurality of regions can be laser-internally-engraved by the region or the regions being scanned.

In one embodiment, the laser internal engraving S4004, S4108 of a larger region or of a plurality of regions can be carried out by the laser light not being focused in a substantially punctiform fashion, but rather in such a way that the focal region has an extent in both directions which are parallel to the surface of the substrate. Regions in which no laser internal engraving is provided can be covered by a device that is non-transmissive, e.g. reflective, for the laser light during the exposure, for example by a mask layer being applied before the exposure.

Both embodiments mentioned above can be combined in a further embodiment.

During the laser internal engraving S4004, S4108, a plurality of lasers can be used, for example simultaneously.

In one embodiment, the same laser can be used for the compaction and the internal engraving, wherein the laser parameters are adapted in each case such that a compaction or an internal engraving can be carried out.

In one embodiment, different lasers can be used for the compaction and the internal engraving.

Known methods are used for the deposition of the electrode and of the organic system and for the encapsulation.

Figure 5:
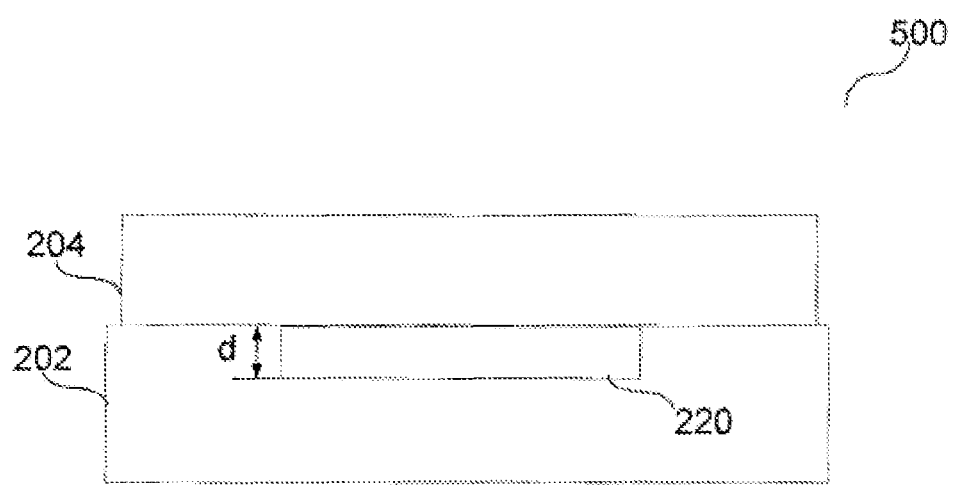
FIG. 5 shows a cross-sectional view of an organic light emitting diode in accordance with various embodiments.

FIG. 5 shows a part of an organic light emitting diode 500 as an implementation of a part of an optoelectronic component in accordance with various embodiments.

The optoelectronic component in the form of an organic light emitting diode 500 may include a substrate 202. The substrate 202 can serve for example as a carrier element for electronic elements or layers, for example optoelectronic elements. The substrate 202 may include glass, for example quartz glass, crown glass, window glass, soda-lime glass or flint glass. The substrate 202 can be embodied as transparent, translucent, partly translucent or partly transparent.

An electrode 204 (for example in the form of an electrode layer 204) can be applied on or above a surface of the substrate 202. The electrode 204 can be formed from an electrically conductive material, such as, for example, a transparent conductive oxide (TCO) or a layer stack of the same or different TCOs. Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, $ZnO$, $SnO_2$, or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs. Furthermore, the TCOs do not necessarily correspond to a stoichiometric composition and can furthermore be p-doped or n-doped. The electrode 204 can be formed as an anode, that is to say as a hole-injecting material.

The electrode 204 can have for example a layer thickness of less than or equal to approximately 25 nm, for example a layer thickness of less than or equal to approximately 20 nm, for example a layer thickness of less than or equal to approximately 18 nm. Furthermore, the first electrode 204 can have for example a layer thickness of greater than or equal to approximately 10 nm, for example a layer thickness of greater than or equal to approximately 15 nm. In various embodiments, the first electrode 204 can have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

The electrode 204 can have for example a layer thickness in a range of approximately 200 nm to approximately 500 nm, for example a layer thickness in a range of approximately 250 nm to approximately 450 nm, for example a layer thickness in a range of approximately 300 nm to approximately 400 nm.

The substrate 202 can have a refractive-index-increased region 220, for example a compacted region 220. The refractive index of the refractive-index-increased region 220 can be increased relative to the refractive index of the substrate.

The compacted region 220 can have been formed for example by one of the method steps described in association with FIGS. 4A and 4B, for example laser compaction before or after the formation of the electrode layer.

The compacted region 220 can have a refractive index that is between the refractive index of the substrate 202 and the refractive index of the electrode 204.

The compacted region can have a thickness d of at least approximately 1 μm, for example a thickness in a range of approximately 2 μm to approximately 12 μm, for example in a range of approximately 5 μm to approximately 6 μm.

Figure 6:
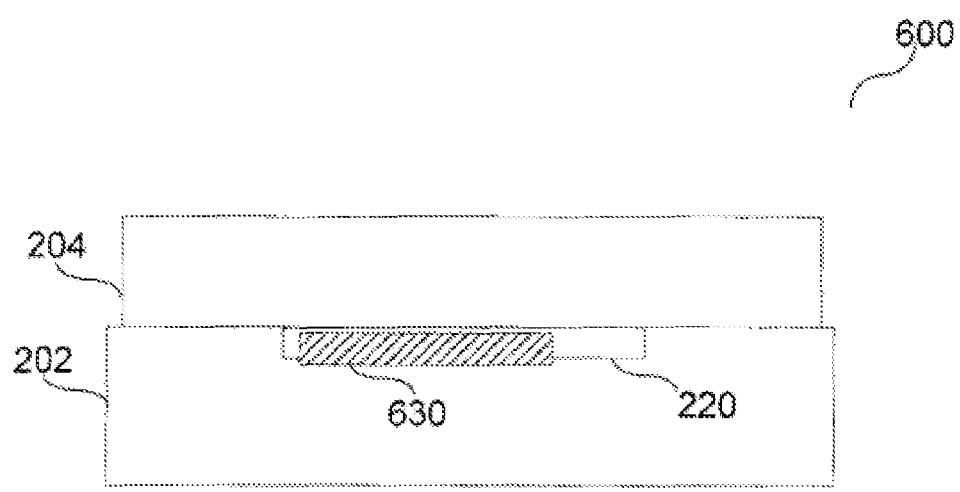
FIG. 6 shows a cross-sectional view of an organic light emitting diode in accordance with various embodiments.

FIG. 6 shows a part of an organic light emitting diode 600 as an implementation of a part of an optoelectronic component in accordance with various embodiments.

In addition to the part of the organic light emitting diode 500 from FIG. 5, the part of the organic light emitting diode 600 can also have a laser-internally-engraved region 630.

The laser-internally-engraved region 630 can have been formed for example by one of the method steps described in association with FIGS. 4A and 4B, for example laser internal engraving after the compaction.

At least one part of the laser-internally-engraved region 630 can be formed within the compacted region 220.

Figure 7:
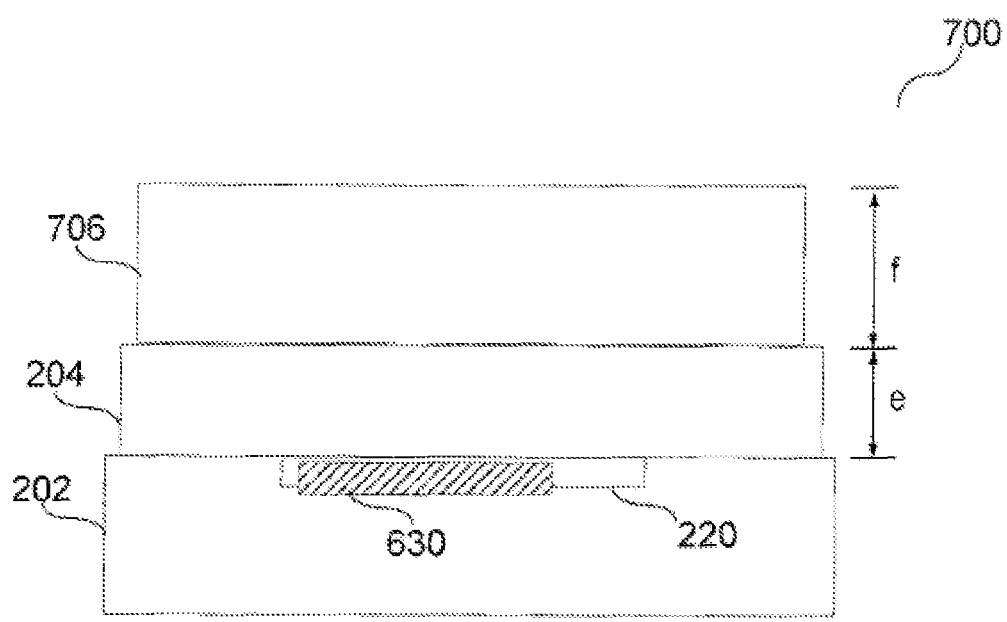
FIG. 7 shows a cross-sectional view of an organic light emitting diode in accordance with various embodiments.

FIG. 7 shows a part of an organic light emitting diode 700 as an implementation of a part of an optoelectronic component in accordance with various embodiments.

In addition to the part of the organic light emitting diode 600 from FIG. 6, the part of the organic light emitting diode 700 can also have an organic functional layer structure 706 arranged on or above the electrode 204.

The organic functional layer structure 706 can contain one or a plurality of emitter layers, for example including fluorescent and/or phosphorescent emitters, and one or a plurality of charge carrier transport layers (electron-conducting layers ETL, derived from the term "electron transport layer", and/or hole-conducting layers HTL, derived from the term "hole transport layer" (not illustrated)).

Examples of emitter materials which can be used in the optoelectronic component in accordance with various embodiments for the emitter layer(s) include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl)iridium III), green phosphorescent Ir(ppy)$_3$(tris(2-phenylpyridine)iridium III), red phosphorescent Ru (dtb-bpy)$_3$*2(PF$_6$) (tris[4,4'-di-tert-butyl-(2,2')-bipyridine]ruthenium-(III) complex) and blue fluorescent DPAVBi (4,4-bis[4-(di-p-tolylamino)styryl]biphenyl), green fluorescent TTPA (9,10-bis[N,N-di(p-tolyflamino]anthracene) and red fluorescent DCM2 (4-dicyanomethylene)-2-methyl-6-julolidyl-9-enyl-4H-pyran) as non-polymeric emitters. Such non-polymeric emitters can be deposited by thermal evaporation, for example. Furthermore, it is possible to use polymer emitters, which can be deposited, in particular, by a wet-chemical method such as spin coating, for example.

The emitter materials can be embedded in a matrix material in a suitable manner.

The emitter materials of the emitter layer(s) of the optoelectronic component 700 can be selected for example such that the optoelectronic component 700 emits white light. The emitter layer(s) may include a plurality of emitter materials that emit in different colors (for example blue and yellow or blue, green and red); alternatively, the emitter layer(s) can also be constructed from a plurality of partial layers, such as a blue fluorescent emitter layer or blue phosphorescent emitter layer, a green phosphorescent emitter layer and a red phosphorescent emitter layer. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a higher wavelength, such that a white color impression results from a (not yet white) primary radiation by virtue of the combination of primary and secondary radiation.

The organic functional layer structure 706 may generally include one or a plurality of functional layers. The one or the plurality of functional layers may include organic polymers, organic oligomers, organic monomers, organic small, non-polymeric molecules ("small molecules") or combinations of these materials. By way of example, the organic functional layer structure 706 may include one or a plurality of functional layers embodied as a hole transport layer, so as to enable for example in the case of an OLED an effective hole injection into an electroluminescent layer or an electroluminescent region. By way of example, tertiary amines, carbazole derivatives, conductive polyaniline or polyethylene dioxythiophene can be used as material for the hole transport layer. In various embodiments, the one or the plurality of functional layers can be embodied as an electroluminescent layer.

In various embodiments, the hole transport layer can be applied, for example deposited, on or above the electrode 204, and the emitter layer can be applied, for example deposited, on or above the hole transport layer.

The optoelectronic component 700 may generally include further organic functional layers which serve to further improve the functionality and thus the efficiency of the optoelectronic component 700.

In various embodiments, the organic functional layer structure 706 can have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm.

In various embodiments, the organic functional layer structure 706 can have for example a stack of a plurality of OLEDs arranged directly one above another, wherein each OLED can have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm.

In various embodiments, the organic functional layer structure 706 can have for example a stack of three or four OLEDs arranged directly one above another, in which case for example the organic functional layer structure 706 can have a layer thickness of a maximum of approximately 6 µm.

In one embodiment, the refractive-index-increased region 220 can have a refractive index which corresponds to a layer-thickness-weighted average value of the refractive indexes of the organic functional layer structure 706 having a thickness f and the electrode 204 having a thickness e.

As a result of the compaction or increase in the refractive index of the substrate 202 in the region 220 at the interface with the transparent electrode 204, that proportion of the light generated in the organic functional layer structure which is reflected at the interface between the electrode 204 and the substrate 202 can be reduced. That proportion of the generated light which is coupled out from the substrate 202 can also be increased as a result.

As a result of the increase in the scattering effect within the region 630, part of the light generated in the organic functional layer structure which has penetrated into the substrate 202 or the refractive-index-increased region 220 at an angle which would have led to total internal reflection at the interface between substrate 202 and surroundings, said interface being situated opposite the surface, can be scattered into an angle which enables the coupling out from the substrate. Consequently, that proportion of the generated light which is coupled out from the substrate 202 can be increased.

Figure 8:
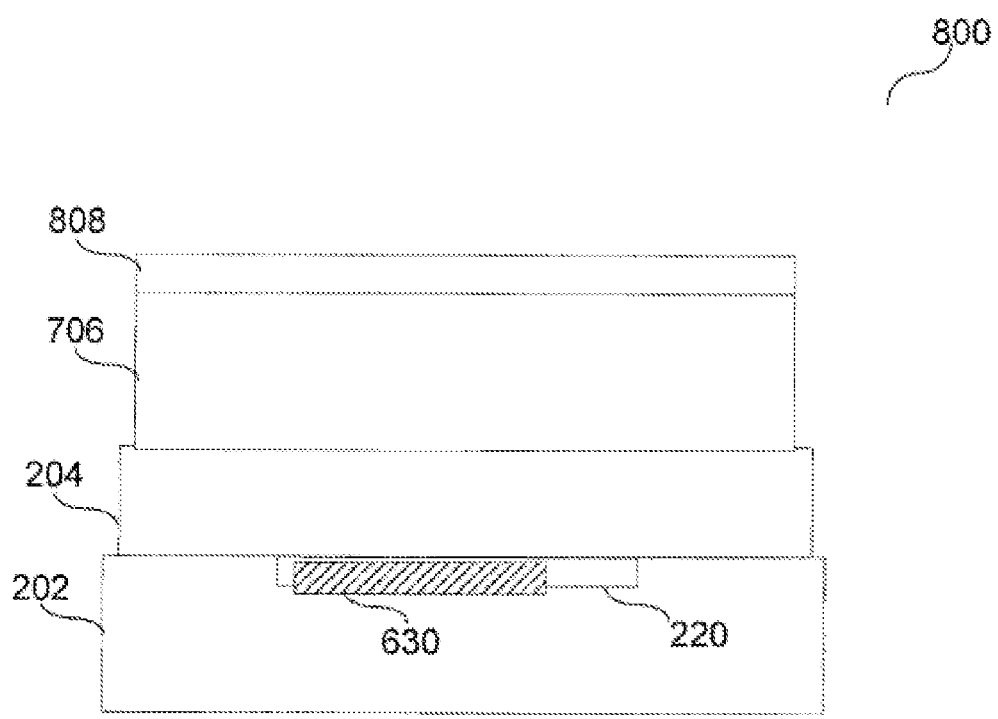
FIG. 8 shows a cross-sectional view of an organic light emitting diode in accordance with various embodiments.

FIG. 8 shows a part of an organic light emitting diode 800 as an implementation of a part of an optoelectronic component in accordance with various embodiments.

In addition to the part of the organic light emitting diode 700 from FIG. 7, the part of the organic light emitting diode 800 can also have a second electrode 808 (for example in the form of a second electrode layer 808), which is arranged on or above the organic functional layer structure 706.

In various embodiments, the second electrode 808 may include or be formed from the same electrically conductive transparent materials as the electrode 204, and/or the second electrode 808 may include a metal (for example Ag, Pt, Au, Mg) or a metal alloy of the materials described (for example an AgMg alloy).

In various embodiments, the second electrode 808 can be formed by a layer stack of a combination of a layer of a metal on a layer of a TCO, or vice versa. One example is a silver layer applied on an indium tin oxide layer (ITO) (Ag on ITO).

In various embodiments, the second electrode 808 can have for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm. In various embodiments, the second electrode 808 can have an arbitrarily greater layer thickness.

The electrode 204 can have for example a layer thickness in a range of approximately 200 nm to approximately 500 nm, for example a layer thickness in a range of approximately 250 nm to approximately 450 nm, for example a layer thickness in a range of approximately 300 nm to approximately 400 nm.

Figure 9:
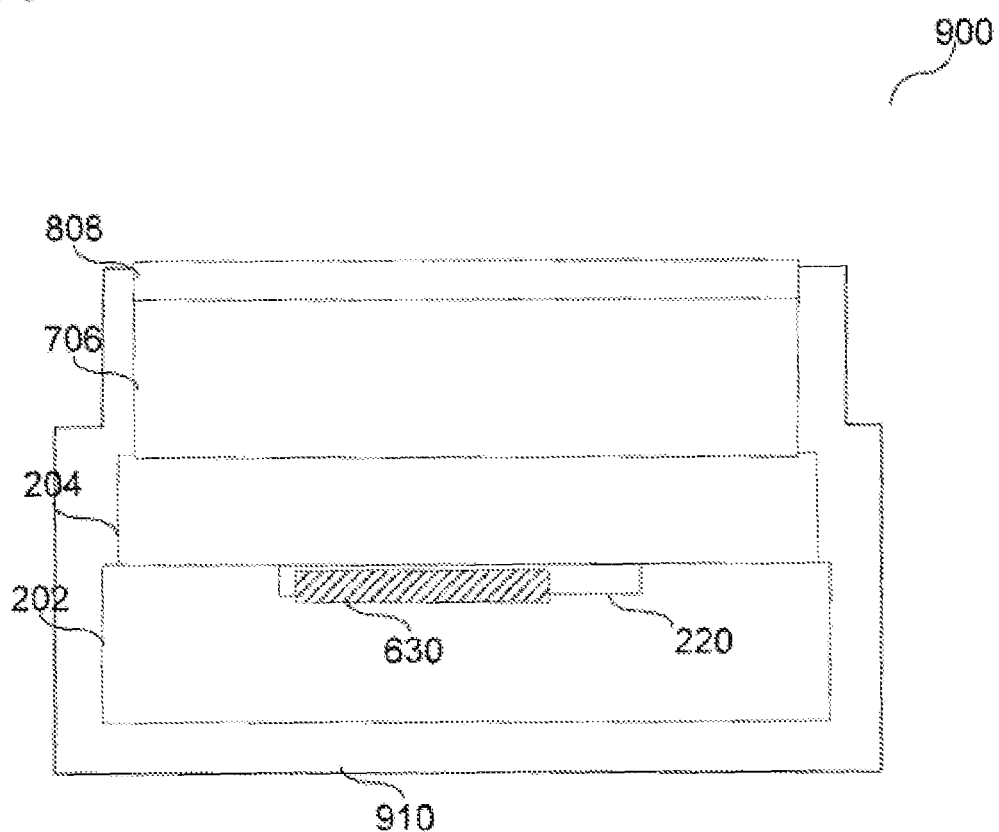
FIG. 9 shows a cross-sectional view of an organic light emitting diode in accordance with various embodiments.

FIG. 9 shows a part of an organic light emitting diode 900 as an implementation of a part of an optoelectronic component in accordance with various embodiments.

In addition to the part of the organic light emitting diode 800 from FIG. 8, the part of the organic light emitting diode in these embodiments may additionally include an encapsulation layer 910.

In various embodiments, the expression "encapsulating" or "encapsulation" is understood to mean, for example, that a barrier or encapsulation layer relative to moisture and/or oxygen is provided, such that these substances cannot penetrate through the organic functional layer structure.

In various embodiments, a thin-film encapsulation layer 910 having a sufficient layer thickness (of at least 1 μm, for example) can be provided as the encapsulation layer 910.

In various embodiments, the thin-film encapsulation layer 910 may include or consist of one or a plurality of the following materials: a material or a mixture of materials or a stack of layers of materials such as, for example, $SiO_2$; $Si_3N_4$; SiON (these materials are deposited for example by a CVD method); $Al_2O_3$; $ZrO_2$; $TiO_2$; $Ta_2O_5$; $SiO_2$; ZnO; and/or $HfO_2$ (these materials are deposited for example by an ALD method); or a combination of these materials.

In various embodiments, the encapsulation of the optoelectronic component can be realized for example by a glass frit encapsulation (glass frit bonding/glass soldering/seal glass bonding).

In the case of a glass frit encapsulation, a glass having a low melting point, which is also designated as a glass frit, can be used as connection between the glass substrate 202 and a cover glass.

A part of the optoelectronic component, for example the electrically active region, for example the organic functional layer structure 706, can be formed between the glass substrate 202 and the cover glass.

The connection of the glass frit to the cover glass, which can form the encapsulation layer 910 in various embodiments, and to the glass substrate 202 can protect the organic functional layer structure 706 laterally in the region of the glass frit against harmful environmental influences.

The encapsulation layer 910 can be embodied as translucent, for example transparent, partly translucent, for example partly transparent.

In various embodiments, the encapsulation layer 910 may include other optically translucent, for example transparent, materials, for example plastic or plastic film.

Figure 10:
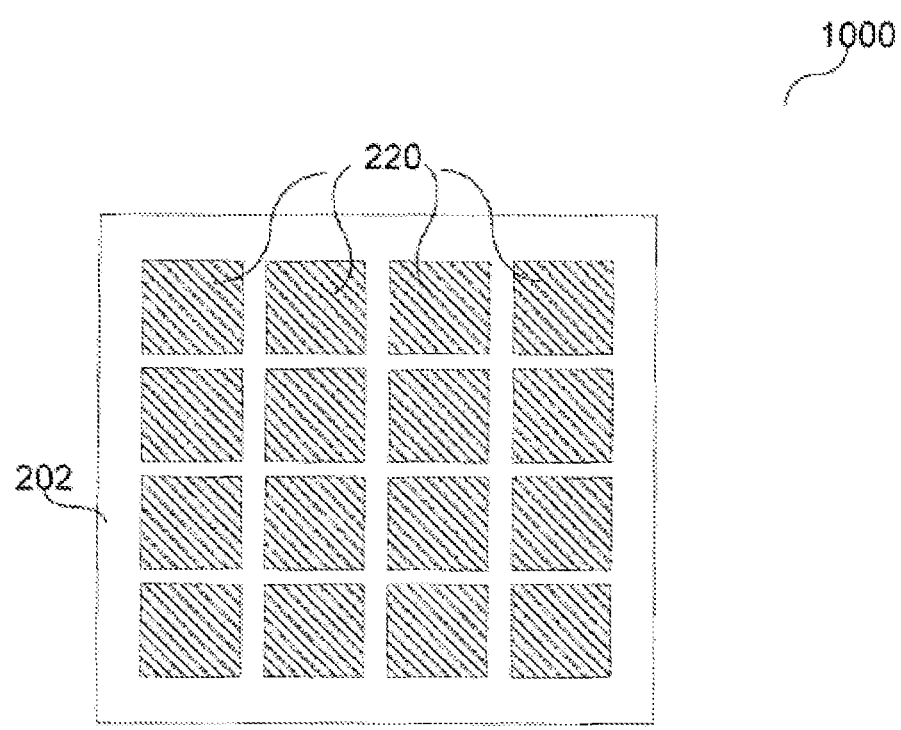
FIG. 10 shows a plan view of an organic light emitting diode in accordance with various embodiments.

FIG. 10 shows a plan view of a part of an organic light emitting diode 1000 as an implementation of a part of an optoelectronic component in accordance with various embodiments.

In various embodiments, the substrate 202 can have a plurality of compacted regions 220, wherein the compacted regions can be arranged in a common layer that is parallel to the surface of the substrate.

In various embodiments, the compacted regions 220 can be formed in the form of a periodic structure.

In various embodiments, the compacted regions 220 can be formed in the form of a non-periodic structure.

In various embodiments, the compacted regions 220 can be separated by non-compacted regions, which can be arranged in the same layer as the compacted regions 220.

The arrangement of the compacted regions 220 in accordance with FIG. 10 can be realized for example in an optoelectronic component in accordance with FIG. 9.

In this case, light which is generated in the organic functional layer system 706 and penetrates through the surface into the substrate 202 and the compacted regions 220 can be reflected at interfaces between compacted regions 220 having an increased refractive index and non-compacted regions of the substrate.

In various embodiments, one or a plurality of regions of the non-compacted substrate 202 can furthermore be decompacted.

In this case, the laser (for example the parameters of wavelength, power, pulse duration, pulse rate and focusing) and the substrate 202 can be coordinated with one another such that a decompacted region or a decompacted layer having a lower refractive index than the non-compacted substrate forms in the irradiated substrate.

With the use of a focusing optical system, the laser power can be applied to a substrate point in a targeted manner, for example to a non-compacted region of the substrate 202 within the layer having the compacted regions 220.

In one embodiment, the decompaction of a larger region or of a plurality of regions can be carried out by changing the relative position of substrate and focused laser light between two exposures. To put it another way, a decompaction of a region can be carried out at an exposure position, then the substrate 202 or the laser device or a part thereof, for example an optical element, can be moved, such that the focal position of the laser light lies in a new region of the substrate 202, and a further exposure or decompaction can subsequently be carried out. To put it another way, the larger region or a plurality of regions can be decompacted by the region or the regions being scanned.

In one embodiment, the decompaction of a larger region or of a plurality of regions can be carried out by the laser light not being focused substantially in a punctiform fashion, but rather in such a way that the focal region has an extent in both directions that are parallel to the surface of the substrate 202. Regions in which no decompaction is provided can be covered by a device that is non-transmissive to the laser light during the exposure, for example by a mask layer being applied before the exposure.

Both embodiments mentioned above can be combined in a further embodiment.

During the decompaction, a plurality of lasers can be used, for example simultaneously.

As a result of the structuring of the refractive-index-increased regions, part of the light generated in the organic functional layer structure which has penetrated into the substrate 202 or the refractive-index-increased region 220 at an angle which would have led to total internal reflection at the interface between substrate 202 and surroundings, said interface being situated opposite the surface, can be reflected at the interface with the regions having a non-increased or reduced refractive index such that it strikes an interface between substrate 202 and surroundings, said interface being situated opposite the surface, at an angle that enables the coupling out from the substrate 202. That proportion of the generated light which is coupled out from the substrate 202 can thus be increased.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing an optoelectronic component, the method comprising:
    increasing a refractive index of a substrate in at least one region at at least one predefined position in the substrate in such a way that the region having an increased refractive index extends as far as a surface of the substrate; and
    forming an electrode layer on or above the surface of the substrate at least partly above the region having an increased refractive index,
    wherein the increasing the refractive index of the substrate in the region having an increased refractive index is carried out by compacting the substrate using a laser.

2. The method as claimed in claim 1, further comprising:
    forming at least one light-scattering region at at least one predefined position in the substrate after forming the refractive-index-increased;
    wherein the at least one light-scattering region is formed at least partly within the at least one region having an increased refractive index.

3. The method as claimed in claim 1,
    wherein the electrode layer is translucent or transparent.

4. The method as claimed in claim 1, further comprising:
    applying a masking that reflects light having a wavelength of the laser on the substrate before forming the region having an increased refractive index; and
    removing the masking after forming the region having an increased refractive index.

5. The method as claimed in claim 2,
    wherein forming the light-scattering region is carried out by locally heating the substrate.

6. The method as claimed in claim 5,
    wherein locally heating the substrate is carried out using a laser.

7. The method as claimed in claim 1, further comprising:
    forming an organic functional layer structure on or above the electrode layer.

8. The method as claimed in claim 7, further comprising:
    forming a second electrode layer on or above the organic functional layer structure.

9. The method as claimed in claim 1, further comprising:
    forming an encapsulation layer.

10. The method as claimed in claim 1,
    wherein the substrate comprises quartz glass, flint glass, window glass, soda-lime glass or crown glass.

11. An optoelectronic component, comprising:
    a substrate; and
    an electrode layer arranged on or above a surface of the substrate;
    wherein the substrate has at the surface at least partly below the electrode layer at least one region having a refractive index increased by an increase in the refractive index of the substrate,
    wherein the substrate is compacted in the at least one region having an increased refractive index.

12. The optoelectronic component as claimed in claim 11, further comprising:
    at least one light-scattering region at at least one predefined position in the substrate;
    wherein the at least one light-scattering region is formed at least partly within the at least one region having an increased refractive index.

13. The optoelectronic component as claimed in claim 11,
    wherein the electrode layer is translucent or transparent.

14. The optoelectronic component as claimed in claim 11, further comprising:
    an organic functional layer structure on or above the electrode layer.

15. The optoelectronic component as claimed in claim 12,
    wherein the substrate is laser-internally-engraved in the at least one light-scattering region.

16. The optoelectronic component as claimed in claim 11,
    wherein the substrate comprises quartz glass, flint glass, window glass, soda-lime glass or crown glass.

17. The optoelectronic component as claimed in claim 14,
    wherein the at least one region having an increased refractive index is configured such that a total internal reflection of light that has penetrated into the substrate from the direction of the organic functional layer structure is possible at at least one region in the layer which does not have an increased refractive index.

18. The optoelectronic component as claimed in claim 14,
    wherein the at least one region in the layer which does not have an increased refractive index has at least one region having a refractive index reduced relative to the non-increased refractive index of the substrate; and
    wherein the substrate is decompacted in the at least one region having a reduced refractive index.

* * * * *